US008962999B2

(12) United States Patent
John et al.

(10) Patent No.: US 8,962,999 B2
(45) Date of Patent: Feb. 24, 2015

(54) MAIN HOUSING ELEMENT OF A MULTI-PART HOUSING AND METHOD FOR ASSEMBLING A HOUSING

(75) Inventors: Jibu John, Kerala (IN); Thomas Fuerst, Mentone (AU); Jörg Huttenlocher, Rutesheim (DE)

(73) Assignee: Robert Bosch GmbH, Stuttgart (DE)

( * ) Notice: Subject to any disclaimer, the term of this patent is extended or adjusted under 35 U.S.C. 154(b) by 361 days.

(21) Appl. No.: 13/634,037

(22) PCT Filed: Mar. 18, 2010

(86) PCT No.: PCT/EP2010/053499
§ 371 (c)(1), (2), (4) Date: Nov. 26, 2012

(87) PCT Pub. No.: WO2011/110232
PCT Pub. Date: Sep. 15, 2011

(65) Prior Publication Data

US 2013/0062091 A1 Mar. 14, 2013

(30) Foreign Application Priority Data

Mar. 11, 2010 (DE) ......................... 10 2010 002 765

(51) Int. Cl.
*H01R 13/46* (2006.01)
*H01R 43/18* (2006.01)
*H05K 3/40* (2006.01)
*H01R 12/70* (2011.01)
*H01R 12/71* (2011.01)
*H01R 43/20* (2006.01)

(52) U.S. Cl.
CPC .......... *H01R 12/7023* (2013.01); *H01R 12/716* (2013.01); *H01R 43/205* (2013.01)
USPC ............................................... 174/59; 338/50

(58) Field of Classification Search
USPC ........... 174/50, 520, 535, 536, 537, 559, 560, 174/561, 59; 361/600, 601, 679.01; 338/315; 439/535; 248/906; 220/4.02
See application file for complete search history.

(56) References Cited

U.S. PATENT DOCUMENTS 4,558,916 A 12/1985 Hehl
6,004,160 A 12/1999 Korsunsky et al.
6,174,185 B1 1/2001 Cecil, Jr.
6,747,542 B1 * 6/2004 Hoehn ............................ 338/50

FOREIGN PATENT DOCUMENTS

DE 19855389 6/2000
JP 2006351330 12/2006

OTHER PUBLICATIONS

PCT/EP2010/053499 International Search Report dated Nov. 24, 2010 (Translation and Original, 4 pages).

* cited by examiner

*Primary Examiner* — Jenny L Wagner
*Assistant Examiner* — Michael P McFadden
(74) *Attorney, Agent, or Firm* — Michael Best & Friedrich LLP

(57) ABSTRACT

The invention relates to a main housing element for a multi-part housing of an electrical device. The main housing element consists of a frame element and at least one connector element integrated in the frame element and produced in one piece with the frame element. The connecting region between the at least one connector element and the frame element is configured as a predetermined breaking point. In the course of assembly of the main housing element a mechanical separation of the connector element from the frame element takes place, whereby the connector element and the frame element are uncoupled.

15 Claims, 4 Drawing Sheets

MAIN HOUSING ELEMENT OF A MULTI-PART HOUSING AND METHOD FOR ASSEMBLING A HOUSING

BACKGROUND OF THE INVENTION

The invention relates to a main housing element for a multi-part housing of an electrical device, to a housing for an electronic device, and to a method for assembling a housing of an electrical device.

Electronic devices are often used as control devices in dust-exposed and/or easily accessible locations of appliances, machines or equipment. As a rule the electronic components are surrounded by a housing which serves as protection against moisture, contamination and/or contact with the electronic device. The housings are frequently produced from plastics material and usually consist of two parts, an upper housing part and a lower housing part. One of the two housing parts, usually the upper housing part, may already be provided with integrated connector elements. Installation of a circuit board in the housing and connection of the installed circuit board assembly to plug connectors of cables or other external plug connectors is thereby simplified, so that outlay for manufacturing and assembly is reduced. The connector elements integrated in the upper housing part have openings into which suitable connector pins arranged on the circuit board can be inserted during assembly of the housing. Alternatively, the connector pins may already be integrated in the connector elements of the housing part prior to assembly of the housing and may be inserted in complementary feedthroughs of the circuit board during assembly. A housing of this type is disclosed, for example, in DE 198 55 389 A1.

As a result of different thermal coefficients of expansion of the circuit board and of the housing part, adequate thermal fatigue resistance of the connector pins at the points of contact may not always be ensured in later operation of the electronic device, especially in the case of soldered connector pins. In addition, the different thermal coefficients of expansion of the circuit board and of the housing part may lead, during assembly of the electronic device, to problems regarding the admissible tolerances in the precise fit between the connector pins and the openings in the connector elements.

SUMMARY OF THE INVENTION

The invention relates to a main housing element for a multi-part housing of an electrical device. The main housing element consists of a frame element and at least one connector element integrated in the frame element and formed in one piece with the frame element. The connecting region between the at least one connector element and the frame element is in the form of a predetermined breaking point. In the course of assembly of the main housing element, a mechanical separation of the connector element from the frame element takes place, whereby the connector element and the frame element are uncoupled. Consequently, on the one hand the advantage that the main housing element is formed in one piece and therefore is simple to produce is retained and, on the other, the effects caused by the thermal expansion properties of the main housing element can be compensated by the uncoupling of frame element and connector element in the finished housing.

In this case the width of the predetermined breaking point, and the distance of the predetermined breaking point from the outer wall of the connector element, determine the width of the gap, produced during assembly, between the connector element and the frame element. The predetermined breaking point is preferably in the form of a channel or groove which surrounds the at least one connector element. The groove may have one or more inclined surfaces. The groove may have, for example, a wedge-shaped cross section. This has the advantage that a spatially very well-defined predetermined breaking point is produced at the apex. An L-shaped groove cross section also produces the desired effect of a well-defined predetermined breaking point.

The connector element preferably has openings into which connector pins, which establish an electrical contact from the underside of the main housing element to the upper side of the main housing element, can be inserted during assembly. Alternatively, connector pins may already be integrated in the connector element, for example injection-molded therein, during the production of the main housing element.

The main housing element preferably has a plurality of fastening means which are arranged both on the frame element and on the at least one connector element and which are suitable for fixing the frame element or the at least one connector element to a circuit carrier and/or to other housing parts, for example by a clip connection The invention further relates to a housing for an electronic device which has a lower housing part and an upper housing part, the upper housing part comprising a frame element and at least one connector element. Connector pins pass from the interior of the housing through the connector element to the outside. The lower housing part may be formed by a circuit carrier such as, for example, a circuit board. Alternatively, an additional housing element which is suitable to receive one or more circuit carriers may be provided as the lower housing part.

Arranged between frame element and connector element is a gap which is delimited on the one side by a breaking point on the frame element and on the other side by the lateral face of the connector element. A first breaking point region is arranged continuously around the lateral faces of the at least one connector element. At least one second breaking point region which surrounds the at least one connector element is arranged on the frame element. These breaking point regions mark the zone in which the frame element and the connector element are separated from one another at a predetermined breaking point during assembly of the housing. The width of the gap is determined by the lateral extent of the two breaking point regions. The connector element therefore has a lateral mobility, limited by the gap width, relative to the frame element.

An electrical circuit is arranged in the interior of the housing. This electrical circuit is preferably arranged on a circuit carrier, in particular a circuit board. Connector pins are contacted with the electrical circuit and lead from the interior of the housing through openings in the connector element to the outside. The connector pins are preferably inserted in feedthroughs of the circuit board and soldered to the circuit board. Alternatively, the connector pins may also be in the form of press-in pins which are inserted with a press fit in the feedthroughs of the circuit board.

In order to protect the circuit in the interior of the housing from the ingress of dirt and moisture, the connector element preferably has in the region of the gap a peripheral projection which is preferably disposed a short distance below or above the gap. A labyrinth seal which effectively prevents the ingress of particles is thus formed between the connector element and the frame element.

In order to further improve the sealing of the housing, in an especially preferred embodiment of the invention a sealing material, for example an adhesive, is arranged between the peripheral projection and the frame element. However, the sealing material should not impede the lateral mobility of the connector element and is therefore preferably configured to be soft and/or flexible.

In order to fix the connector element effectively to the lower housing part, preferably at least one fastening means is formed on the connector element. Preferably, a plurality of fastening pegs embodied integrally with the connector element and projecting in the direction of the lower housing part are formed. The fastening pegs preferably have fork-like ends which are suited to engage in corresponding receptacles of the lower housing part and to latch therein. In an especially preferred embodiment of the invention, the circuit carrier arranged in the housing has bores through which the fastening pegs pass, so that fixing of the circuit carrier to the lower housing part is achieved at the same time as fixing of the connector element. For this purpose the receptacles of the lower housing part preferably have abutment faces for the circuit carrier.

In order to fix the frame element to the lower housing part, the frame element preferably has at least one fastening means. The lower housing part has at least one corresponding receptacle, the at least one fastening means engaging in the at least one receptacle of the lower housing part and the frame element thereby being fixed to the lower housing part. In an especially preferred embodiment, a plurality of hook-like projections are formed on the lateral faces of the frame element. As the receptacles, corresponding openings are arranged in the lateral faces of a lower housing part constructed in the form of a shell. The hook-like projections on the lateral faces of the frame element engage in the openings in the lateral faces of the lower housing part and thus fix the frame element to the lower housing part.

To further improve the sealing of the housing, a sealing means, for example an adhesive, may be applied to the connection between frame element and lower housing part.

The invention relates, in addition, to a method for assembling a housing for an electronic device which has the above-described advantages. A main housing element with the above-described advantages is used as the upper housing part.

After the upper housing part has been placed on the lower housing part, pressure is exerted on the upper housing part. A pressure exerted perpendicularly to the cover surface of the upper housing part is especially advantageous.

As a result of the pressure, at least one connector element is separated mechanically from a frame element of the upper housing part at a predetermined breaking point. In addition, fastening means of the upper housing part are pressed into receptacles of the lower housing part until they latch therein. As this happens, a vertical offsetting of the frame element with respect to the connector element takes place.

In this method there is produced a housing for an electronic device which has the above-described advantages with respect to compensation of the different coefficients of thermal expansion of the housing material and the material of a circuit carrier optionally arranged in the housing.

In a preferred configuration of the method according to the invention, the following process steps are carried out successively:

The main housing element is first aligned, with the aid of a suitable holding device, relative to a lower housing part, in which a circuit carrier has optionally already been placed, and is placed on the lower housing part.

Pressure is then exerted, for example by means of a plunger device, on the upper housing part, preferably on the frame element, perpendicularly to the cover surface of the upper housing part. Fastening means arranged on the connector element are thereby pressed into corresponding receptacles of the lower housing part and latch therein.

Pressure then continues to be exerted on the frame element. As the connector element is already in a fixed position, the exertion of pressure causes a mechanical separation of frame element and connector element at the predetermined breaking point provided, which, according to the invention, is arranged in the region of the connection between the frame and the connector element. The frame element is pressed down further until fastening means of the frame element latch in corresponding receptacles of the lower housing part and thereby fix the frame element.

An alternative preferred configuration of the method according to the invention provides a different sequence:

Analogously to the first variant, the main housing element is first aligned, with the aid of a suitable holding device, relative to a lower housing part, in which a circuit carrier has optionally already been placed, and is placed on the lower housing part.

Pressure is then applied in a specified manner to the frame element, for example by means of a plunger device, perpendicularly to the cover surface of the upper housing part. The frame element and the at least one connector element are thereby separated mechanically from one another at the predetermined breaking point provided, which, according to the invention, is arranged in the region of the connection between the frame and the connector element. Pressure is applied to the frame element until fastening means of the frame element latch in corresponding receptacles of the lower housing part.

In the next step pressure is applied to the now freely detached connector element until fastening means arranged on the connector element latch in corresponding receptacles of the lower housing part.

In a preferred embodiment of the housing according to the invention, the circuit carrier has feedthroughs in which connector pins are contacted electrically. In the course of the method according to the invention, the connector pins are passed through corresponding openings of the at least one connector element. An especial advantage of the second exemplary configuration of the method according to the invention becomes apparent here. Since the connector element has already been separated from the frame element and has a certain lateral mobility at the time when the connector element is moved to its final position, tolerances in the alignment of the connector pins or of the openings in the connector element can be easily compensated.

In an alternative preferred embodiment of the housing according to the invention, at least one connector element has integrated connector pins. In the course of the method the connector pins are inserted and electrically contacted in corresponding feedthroughs of the circuit carrier arranged in the lower housing part. Here too, the second variant of the method has the especial advantage that the connector element has already been separated from the frame element and has a certain lateral mobility at the time when the connector element is moved to its final position. Tolerances in the alignment of the connector pins relative to the feedthroughs can therefore be easily compensated.

BRIEF DESCRIPTION OF THE DRAWINGS

The invention is explained in more detail below with reference to a number of drawings in which.

DETAILED DESCRIPTION

Figure 1A:
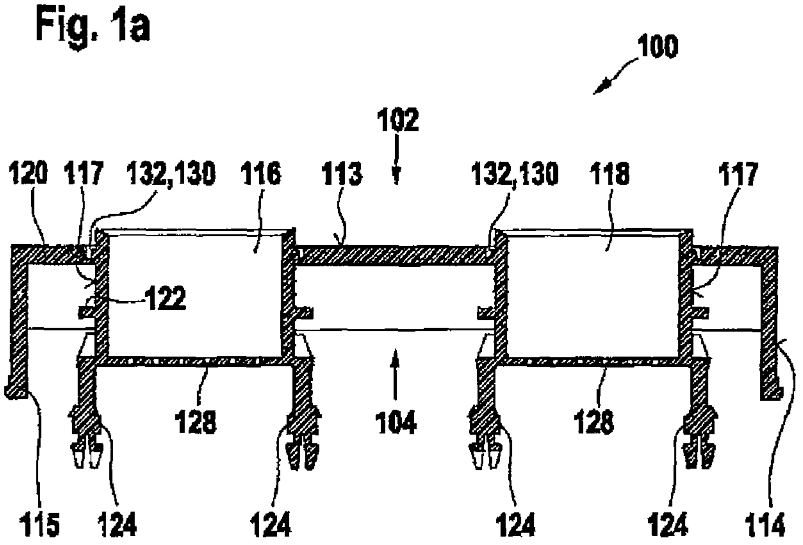
FIG. 1*a* shows a section through a main housing element according to an exemplary embodiment of the invention.
Figure 1B:
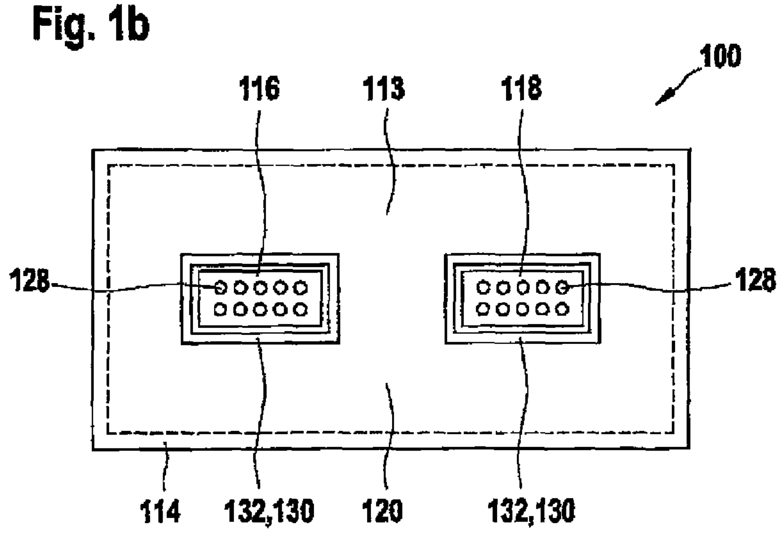
FIG. 1*b* is a top view of the main housing element from FIG. 1*a*.

FIGS. 1*a* and 1*b* show a main housing element 100 according to the invention. The main housing element 100 is constructed in one piece. In this example it is made of plastics material and is produced, for example, using the injection molding process. The main housing element 100 has a frame element 120, which essentially has the function of covering a housing. The frame element has a cover surface 113 and a peripheral edge surface 114. Projections 115 which are suited to fixing the frame element by means of a clip connection are arranged along the corner of the edge surface. In this example the cover surface 113 has a rectangular configuration. Alternatively, however, any other shape is possible.

The main housing element 100 further includes two connector elements 116 and 118 which are formed integrally with the frame element 112. The connector elements have a pot-like structure and have in their base surfaces openings 128 which are suitable for the insertion of connector pins in order to establish an electrical contact from the underside 104 to the upper side 102 of the main housing element.

The connector elements 116 and 118 have a peripheral projection 122 on their respective outer surface 117. Each of the connector elements 116 and 118 further has fastening pegs 124 which are formed integrally with the connector elements and are suited to fixing each connector element 116, 118 to a second housing part by means of a clip connection. For this purpose the fastening pegs 124 have a forked configuration at their ends and include a slit.

The connector elements 116 and 118 are integrated in the frame element 120. In this exemplary embodiment of the invention, the region 132 which surrounds each of the connector elements and which represents the connection to the frame element is in the form of a groove. This region therefore has a lesser material thickness in comparison to the remaining cover surface 113 and is suited to forming a predetermined breaking point 130, at which the connector elements 116 and 118 can be separated from the frame element 120 in the course of assembly of the main housing element 100. The edge face of the groove oriented towards the frame element 120 is disposed perpendicularly while the edge face of the groove oriented towards the connector element 116, 118 has a stepped configuration, so that an approximately L-shaped groove cross section is produced. The groove is arranged at a certain distance from the lateral faces 117 of the respective connector elements 116 and 118. This distance determines the width of the gap between the frame element 120 and the respective connector element 116, 118 which is produced in the course of assembly.

Figure 2A:
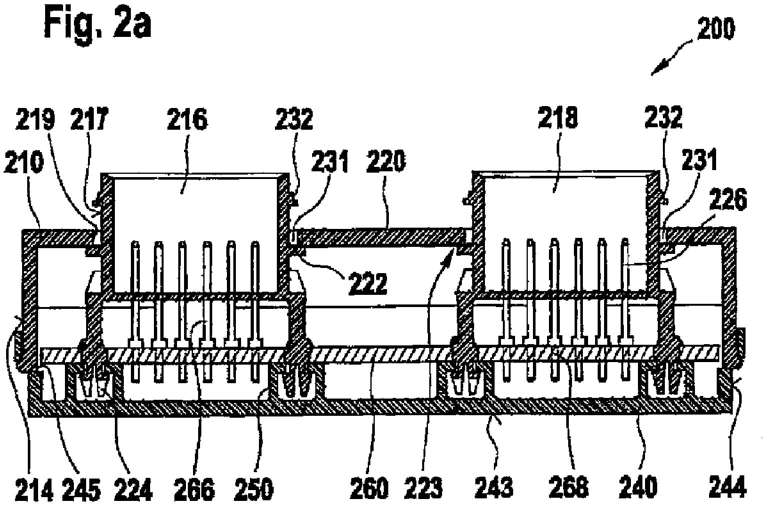
FIG. 2*a* shows a section through a fully assembled housing according to a further exemplary embodiment of the invention.
Figure 2B:
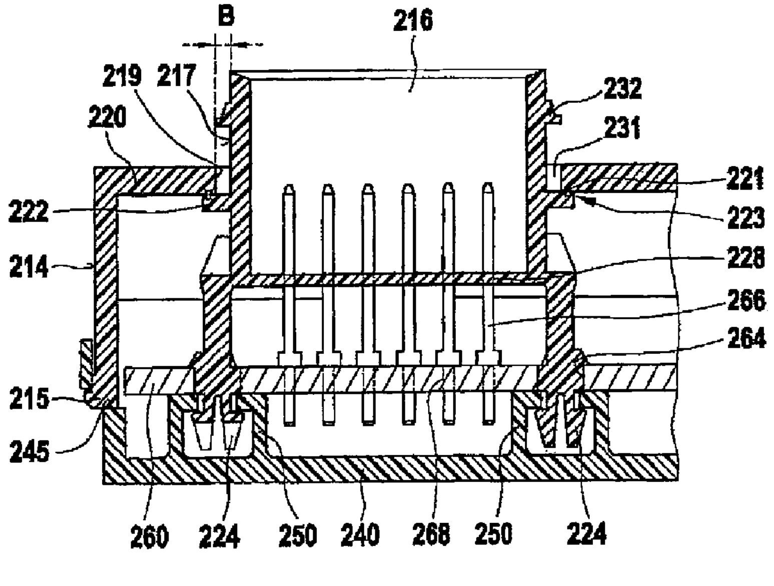
FIG. 2*b* shows a detail from the housing represented in FIG. 2*a*.

FIGS. 2*a* and 2*b* show a housing 200 for an electronic device, for example a control unit for a motor vehicle. The housing consists essentially of a lower housing part 240, a circuit board 260 arranged in the lower housing part 240 and an upper housing part 210. The upper housing part 210 consists of a frame element 220 and two connector elements 216 and 218. In this example the lower housing part 240 has a shell-like structure and has a base surface 243 and a peripheral lateral surface 244. The shape of the base surface 243 is adapted to the shape of the cover surface 213 of the frame element 220. The lateral surface 244 has openings 245 which serve as a receptacle for the frame element 220. For this purpose the frame element 220 has on its lateral surface 214 projections 215 which engage in the openings 245 of the lower housing part 220 and fix the frame element 220 to the lower housing part 240 by means of a clip connection. In addition, the lower housing part 240 has holding devices 250 arranged on its base surface, which holding devices 250 serve on the one hand as abutment faces for the circuit board 260 and on the other as receptacles for fastening means of the connector elements 216 and 218. For this purpose fastening pegs 224 arranged on the connector elements 216 and 218 pass through corresponding openings 264 of the circuit board 260 and form a clip connection with the holding devices 250, whereby both the connector elements 216 and 218 and the circuit board 260 are fixed to the lower housing part 240.

Arranged on the circuit board 260 are connector pins 266 which establish electrical contact of the circuit (not shown) arranged on the circuit board to the outside. The connector pins 266 are inserted in feedthroughs 268 of the circuit board 260 and are soldered to the rear side of the circuit board 260. The free ends of the connector pins 266 pass to the outside through corresponding openings 228 in the connector elements 216 and 218.

The connector elements 216 and 218 are separated from the surrounding frame element 220 by a gap 231. As shown in FIG. 1, the connector elements 216 and 218 are produced integrally with the frame element 220 and are separated from one another at predetermined breaking points during assembly. A gap 231 is formed between the respective connector element 216, 218 and the frame element 220, the configuration of the original predetermined breaking point determining the width B of the gap 231. A respective first breaking point region 232 in the form of a peripheral ridge is arranged on the connector elements 216 and 218 above the gap 231. The ridge represents a remnant of the original predetermined breaking point which, as set forth in the description of FIG. 1, was in the form of a groove with an L-shaped cross section. A second breaking point region 219 is arranged on the frame element 220. The gap 231 is delimited by the second breaking point region 219 and the lateral surface 217 of the respective connector element 216, 218. The width B of the gap 231 is determined by the respective lateral extents of the breaking point regions 232 and 219. The gap 231 produces a limited lateral mobility of the connector elements 216 and 218. The lateral mobility of the connector elements 216 and 218 relative to the frame element 220 has the result that compensation of the different thermal expansions of connector elements 216, 218 and of the circuit board 260 can take place. Stresses which may be exerted on the contacts between the connector pins 266 and the circuit board 260 are therefore avoided and sufficient thermal fatigue resistance of the electrical contacts of the connector pins 266 is ensured.

In order to prevent penetration of dirt or moisture into the housing through the gap 230, the connector elements each have a respective peripheral projection 222 which is disposed directly below the gap. The width of the projection 222 is at least equal to the width of the gap 230. A labyrinth seal 223 which impedes the ingress of foreign bodies is therefore formed between the connector elements 216 and 218 and the frame element 220. In order to prevent the penetration of moisture and/or dirt particles still more effectively, a sealing material 221 may additionally be arranged between the projection 222 and the frame element 320. Advantageously, the sealing material should have flexibility sufficiently high that the lateral mobility of the connector elements 216 and 218 is retained.

Figure 3A:
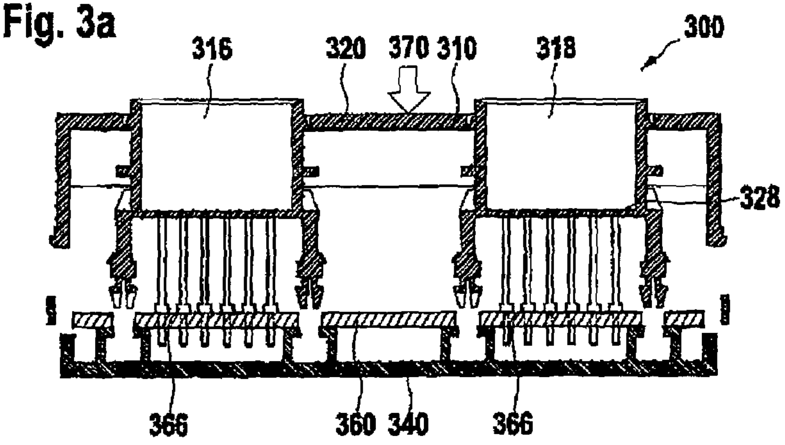
FIGS. 3 *a-c* represent a first exemplary embodiment of a method according to the invention for assembling a housing for an electronic device.

FIG. 3 illustrates a method according to the invention for assembling a housing 300 for an electronic device. As shown in FIG. 3*a*, the following components are used for this purpose: a lower housing part 340 with a circuit board 360 arranged therein, and a main housing element 310 consisting of a frame element 320 and two connector elements 316 and 318 integrated in the frame element 320. The lower housing part 340 and the main housing element 310 are each held in respective close-fitting receptacles (not shown) during the assembly process. In the first step the main housing element 310 is aligned relative to the lower housing part 340 so that connector pins 366 arranged on the circuit board are brought into alignment with the corresponding openings 328 arranged in the connector elements 316 and 318, and so that fastening pegs 324 of the connector elements 316 and 318 are positioned above the corresponding openings 364 in the circuit board 360 and above corresponding receptacles 350 in the lower housing part 340.

Figure 3B:
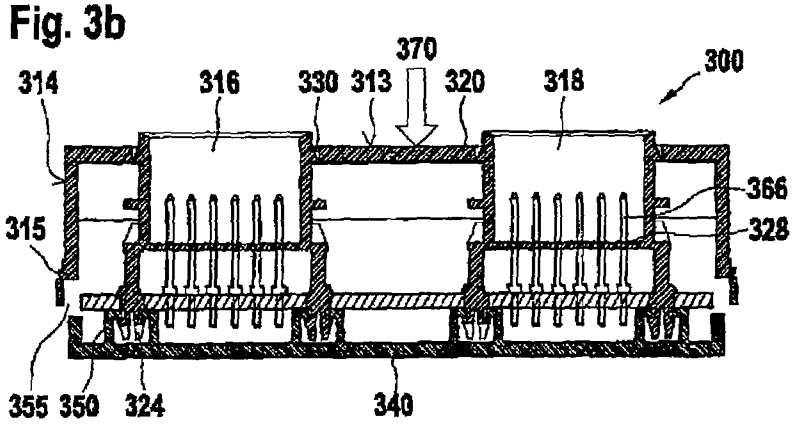

As shown in FIG. 3*b*, in the next step the connector pins 366 are passed through the openings 328 by the exertion of uniform pressure, for example by a suitable plunger device (not shown), on the main housing element 310 in the direction 370 perpendicular to the cover surface 313 of the main housing element 310; the fastening pegs 324 then engage in the receptacles 350 in the lower housing part 340 and form a clip connection. The connector elements 316 and 318 are thus fixed in the lower housing part 340 and are in their final position.

The respective connecting region between the connector elements 316 and 318 and the frame element 320 has a predetermined breaking point 330 which is in the form of a groove with a substantially L-shaped cross section. In the following process step the connector elements 316 and 318 and the frame element 320 are separated from one another at the predetermined breaking point 330 by continued exertion of pressure on the frame element 320 in the direction 370. The frame element is pressed down until fastening means 315 arranged on the peripheral lateral surface 314 latch in corresponding openings 355 of the lower housing part 340 and form a clip connection.

Figure 3C:
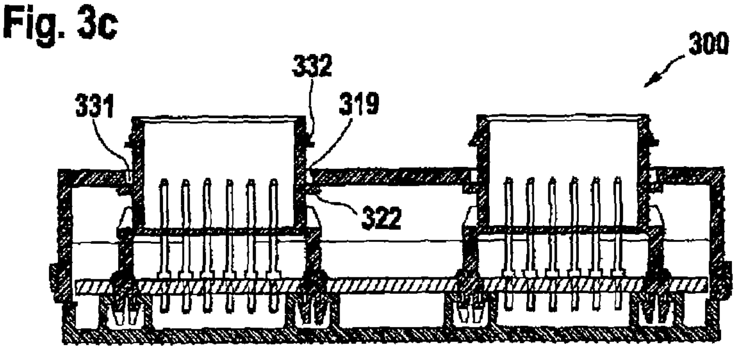

Assembly of the housing is thereby completed. The finished housing is shown in FIG. 3*c* and corresponds substantially to the housing of FIG. 2. As a result of the configuration of the predetermined breaking point 330 as a groove with an L-shaped cross section, a first breaking point region 332, the lateral extent of which determines the width of the gap 331, remains behind as a peripheral ridge on each of the connector elements 316 and 318. A second breaking point region 319 is arranged on the frame element and delimits the gap 331. The connector contacts of the resulting housing have high temperature stability, since stresses through the different thermal expansions of the connector elements 316, 318 and of the circuit board 360 can be compensated by the lateral mobility of the connector elements 316 and 318. The penetration of dirt and/or moisture into the gap 330 is prevented by a peripheral projection 322 on the respective connector element 316, 318, which projection 322 forms a labyrinth seal together with the frame element 320. The projection 322 is arranged below the gap and its width is at least equal to the width of the gap 330.

An alternative method for assembling a housing 400 is represented in FIG. 4. The method differs from the method described previously by the sequence in which the process steps are carried out.

Figure 4A:
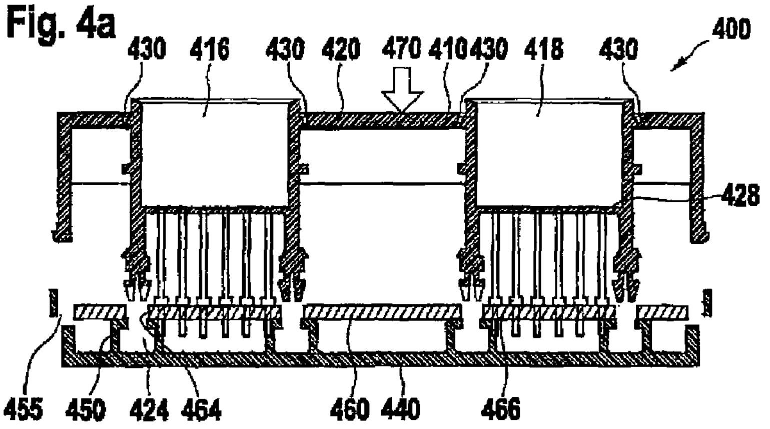
FIGS. 4 *a-c* represent a second exemplary embodiment of a method according to the invention for assembling a housing for an electronic device.

As shown in FIG. 4*a*, the following components are used: a lower housing part 440 with a circuit board 460 arranged therein, and a main housing element 410 consisting of a frame element 420 and two connector elements 416 and 418 integrated in the frame element 420. During the assembly process the lower housing part 440 and the main housing element 410 are held in respective close-fitting receptacles (not shown).

In the first step the main housing element 410 is aligned relative to the lower housing part 440 so that connector pins 466 arranged on the circuit board are brought into alignment with the corresponding openings 428 arranged in the connector elements 416 and 418, and so that fastening pegs 424 of the connector elements 416 and 418 are positioned above the corresponding openings 464 in the circuit board 460 and above the receptacles 450 in the lower housing part 440.

Figure 4B:
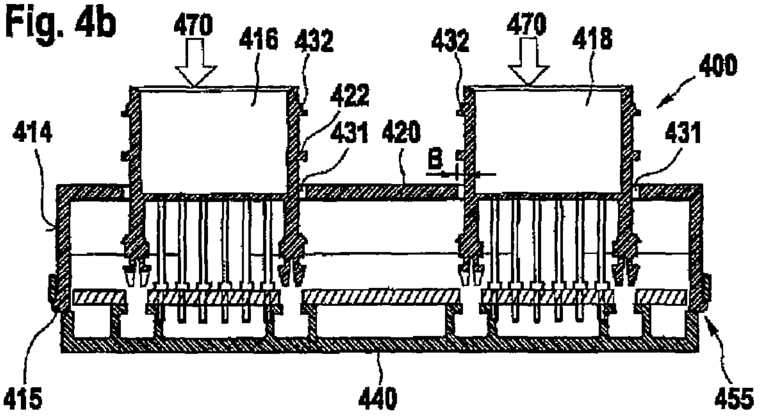

The respective connecting region between the connector elements 416 and 418 and the frame element 420 has a predetermined breaking point 430 which is in the form of a groove with a substantially L-shaped cross section. By means of a specified exertion of pressure, for example by a suitable plunger device (not shown), on the main housing element 410 in a direction 470 perpendicular to the cover surface 413 of the main housing element 410, the frame element 420 and the connector elements 416 and 418 are separated from one another at the respective predetermined breaking points 430. The frame element 420 is pressed down until the fastening means 415 arranged on the peripheral lateral surface 414 latch in corresponding openings 455 of the lower housing part 440 and form a clip connection, as represented in FIG. 4*b*. As a result of the configuration of the predetermined breaking point 430 as a groove with an L-shaped cross section, a first breaking point region 432, the lateral extent of which determines the width of the gap 431, remains behind as a peripheral ridge on each of the connector elements 416 and 418.

Figure 4C:
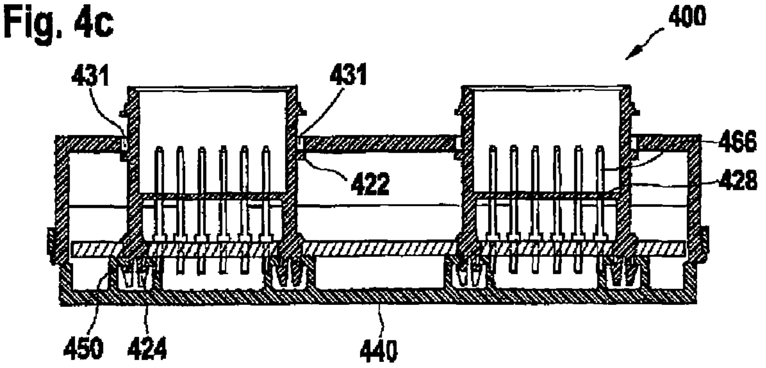

In the next step the connector pins 466 are passed through the openings 428 as a result of the exertion of uniform pressure, for example by a suitable plunger device (not shown), on each of the connector elements 416 and 418 in a direction 470 perpendicular to the cover surface 413 of the main housing element 410; then the fastening pegs 424 engage in the receptacles 450 in the lower housing part 440 and form a clip connection. The connector elements 416 and 418 are thereby fixed in the lower housing part 440 and are in their final position. The finished housing is represented in FIG. 4*c*.

In this example also, the connector elements 416 and 418 each have in the region of the gap 431 a respective peripheral projection 422 which impedes the ingress of dirt and moisture into the finished housing. However, this projection 422 must not exceed the width of the gap 422, since the connector elements could not otherwise be pressed into their final position. Preferably, the projection 422 has a width slightly smaller than the width B of the gap 431.

If this variant of the method is used, it must be ensured that the gap is selected wide enough to enable the connector elements 416 and 418 to be pressed down unimpeded in the second step.

The connector contacts of the housing produced in this way have high temperature stability, as stresses through the different thermal expansions of the connector elements 416, 418 and of the circuit board 460 can be compensated by the limited lateral mobility of the connector elements 416 and 418.

Since the separation of the frame element 420 from the connector elements 416 and 418 takes place before the fixing of the connector elements 416 and 418 in this variant of the method, the connector elements already have lateral mobility when they are pressed into their final position in the second step of the process. As a result of this mobility, tolerances in the alignment of the connector pins 466 relative to the openings 428 in the connector elements can be compensated, whereby assembly is significantly simplified.

The invention claimed is:

1. A main housing element (110, 310, 410) for a housing (200, 300, 400) of an electronic device, comprising a frame element (120, 220, 320, 420) and at least one connector element (116, 118, 216, 218, 316, 318, 416, 418), wherein the at least one connector element (116, 118, 316, 318, 416, 418) and the frame element (120, 220, 320, 420) are formed in one piece and the frame element (120, 320, 420) surrounds the at least one connector element (116, 118, 316, 318, 416, 418), characterized in that the connection of the frame element (120, 320, 420) to the connector element (116, 118, 316, 318, 416, 418) includes a predetermined breaking point (130, 330, 430) which leads in the course of assembly of the main housing element (110, 310, 410) in the housing (200, 300, 400) to a separation of the at least one connector element (116, 118, 216, 218, 316, 318, 416, 418) from the frame element (120, 320, 420).

2. The main housing element according to claim 1, characterized in that the predetermined breaking point (130, 330, 430) is in the form of a groove between the at least one connector element (116, 118, 316, 318, 416, 418) and the frame element (120, 320, 420).

3. The main housing element according to claim 1, characterized in that at least one connector element (116, 118) has openings (128) through which connector pins (266, 366, 466) can be passed and are suited to establishing an electrical contact from an underside (104) of the main housing element to an upper side (102) of the main housing element.

4. The main housing element according to claim 1, characterized in that at least one connector element has integrated connector pins which are suited to establishing an electrical contact from an underside (104) of the main housing element to an upper side (102) of the main housing element.

5. A housing (200, 300, 400) for an electronic device, wherein the housing includes a lower housing part (240, 340, 440, 260, 360, 460), a frame element (220, 320, 420)

and at least one connector element (216, 218, 316, 318, 416, 418)

and wherein connector pins (266, 366, 466) pass from a interior of the housing through the connector element (216, 218, 316, 318, 416, 418) to an outside, characterized in that a first breaking point region (232, 332, 432) is arranged peripherally around lateral surfaces (217, 317, 417) of the at least one connector element (216, 218, 316, 318, 416, 418), at least one second breaking point region (219, 319, 419) which surrounds the at least one connector element (216, 218, 316, 318, 416, 418) is arranged on the frame element (220, 320, 420), and in that a gap (231, 331, 431) is formed between the frame element (220, 320, 420) and the connector element (216, 218, 316, 318, 416, 418), which gap (231, 331, 431) is delimited by the lateral surface (217, 317, 417) of the connector element (216, 218, 316, 318, 416, 418) and by the second breaking point region (219, 319, 419), and the width of which gap (231, 331, 431) is determined by a lateral extent of the first breaking point region (232, 332, 432) and a lateral extent of the second breaking point region (219, 319, 419), whereby lateral mobility of the connector element (216, 218, 316, 318, 416, 418) relative to the frame element (220, 320, 420) is obtained.

6. The housing according to claim 5, characterized in that the connector element (216, 218, 316, 318) has in the region around the gap (231, 331) a peripheral projection (222, 322) which, in cooperation with the frame element and the gap (231, 331), forms a labyrinth seal (223, 323) between the connector element (216, 218, 316, 318) and the frame element (220, 320).

7. The housing according to claim 6, characterized in that a flexible sealing material (221), which seals the gap (231) is arranged peripherally in the region around the gap (231) between the peripheral projection (222) and the frame element (220).

8. The housing according to claim 5, characterized in that the connector element (216, 218, 316, 318, 416, 418) has at least one fastening means (224, 324, 424) and the lower housing part (240, 340, 440, 260, 360, 460) has at least one corresponding receptacle (250, 264, 350, 450), the at least one fastening means (224, 324, 424) latching in the at least one receptacle (250, 264, 350, 450) of the lower housing part (240, 340, 440) and thereby fixing the connector element (216, 218, 316, 318, 416, 418) to the lower housing part (240, 340, 440).

9. The housing according to claim 5, characterized in that the frame element (220, 320, 420) has at least one fastening means (215, 315, 415) and the lower housing part (240, 260, 340, 360, 440, 460) has at least one corresponding receptacle (255, 355, 455), the at least one fastening means (215, 315, 415) latching in the at least one receptacle (255, 355, 455) of the lower housing part (240, 340, 440) and thereby fixing the frame element (220, 320, 420) to the lower housing part (240, 340, 440).

10. The housing according to claim 5, characterized in that there is arranged in the housing a circuit board (260, 360, 460), on which are contacted connector pins (266, 366, 466) which pass through the connector elements (216, 218, 316, 318, 416, 418) to the outside.

11. The method for assembling a housing according to claim 5, using a lower housing part (340, 440, 360, 460) and a main housing element (310, 410) including a frame element (120, 220, 320, 420) and at least one connector element (116, 118, 216, 218, 316, 318, 416, 418), wherein the at least one connector element (116, 118, 316, 318, 416, 418) and the frame element (120, 220, 320, 420) are formed in one piece, and the frame element (120, 320, 420) surrounds the at least one connector element (116 118, 316, 318, 416, 418), wherein the connection of the frame element (120, 320, 420) to the connector element (116, 118, 316, 318, 416, 418) includes a predetermined breaking point (130, 330, 430) which leads in the course of assembly of the main housing element (110, 310, 410) in the housing (200, 300, 400) to a separation of the at least one connector element (116, 118, 216, 218, 316, 318, 416, 418) from the frame element (120, 320, 420), characterized by the following process steps:

a. placing the upper housing part (310, 410) on the lower housing part (340, 440, 360, 460), and b. exerting pressure on the upper housing part (310, 410), in particular perpendicularly to the cover surface (313, 413) of the upper housing part, whereby at least one connector element (316, 318, 416, 418) is separated mechanically from a frame element (320,

420) of the upper housing part (310, 420) at a predetermined breaking point (331, 431), and fastening means (315, 324, 415, 424) of the upper housing part (310, 410) latch in receptacles (350, 355, 450, 455) of the lower housing part (340, 440, 360, 460).

12. The method according to claim 11, characterized in that a circuit board (360, 460) which has feedthroughs (368, 468) in which connector pins (366, 466) are electrically contacted, is arranged in the lower housing part (340, 440), the connector pins (366, 466) passing through corresponding openings (328, 428) of the at least one connector element (316, 318, 416, 418) in the course of the method.

13. The method according to claim 11, characterized in that connector pins (366, 466) are integrated in the at least one connector element (316, 318, 416, 418), the connector pins (366, 466) being inserted and electrically contacted in corresponding feedthroughs (368, 468) of a circuit carrier (360, 460) arranged in the lower housing part (340, 440) in the course of the method.

14. The method for assembling a housing (300) according to claim 11, whereby fastening means (324) arranged on the at least one connector element (316, 318) latch in corresponding receptacles (350) of the lower housing part (340), and further comprising exerting pressure on the frame element (320), whereby at least one connector element (316, 318) is separated mechanically from a frame element (320) of the upper housing part (310) at a predetermined breaking point (330), and fastening means (315) of the frame element (320) latch in corresponding receptacles (355) of the lower housing part (340).

15. The method for assembling a housing (400) according to claim 11, whereby at least one connector element (416, 418) and the frame element (420) are separated mechanically from one another at a predetermined breaking point (430), and fastening means (415) of the frame element (420) latch in corresponding receptacles (455) of the lower housing part (440), and further comprising exerting pressure on the at least one connector element (416, 418), perpendicularly to the cover surface (413) of the upper housing part (410), whereby fastening means (424) arranged on the at least one connector element (416, 418) latch in corresponding receptacles (450) of the lower housing part (440).

* * * * *